(12) United States Patent
Choi

(10) Patent No.: US 9,048,235 B2
(45) Date of Patent: Jun. 2, 2015

(54) STACK PACKAGE AND METHOD OF MANUFACTURING STACK PACKAGE

(71) Applicant: Samsung Electronics Co., Ltd., Suwon-si, Gyeonggi-do (KR)

(72) Inventor: Yun-Seok Choi, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/167,989

(22) Filed: Jan. 29, 2014

(65) Prior Publication Data

US 2014/0217616 A1 Aug. 7, 2014

(30) Foreign Application Priority Data

Feb. 4, 2013 (KR) .................. 10-2013-0012190

(51) Int. Cl.
| | |
|---|---|
| *H01L 25/07* | (2006.01) |
| *H01L 25/00* | (2006.01) |
| *H01L 23/00* | (2006.01) |
| *H01L 25/065* | (2006.01) |
| *H01L 21/66* | (2006.01) |

(52) U.S. Cl.
CPC ............... *H01L 25/50* (2013.01); *H01L 24/94* (2013.01); *H01L 25/0657* (2013.01); *H01L 2224/0401* (2013.01); *H01L 2224/0557* (2013.01); *H01L 2224/06181* (2013.01); *H01L 2224/16145* (2013.01); *H01L 2224/16225* (2013.01); *H01L 2225/06517* (2013.01); *H01L 2924/15311* (2013.01); *H01L 2225/06513* (2013.01); *H01L 2225/06541* (2013.01); *H01L 2225/06565* (2013.01); *H01L 22/14* (2013.01); *H01L 22/20* (2013.01)

(58) Field of Classification Search
CPC .............................. H01L 25/074; H01L 25/50
USPC ..................................... 257/686, 777; 438/15
See application file for complete search history.

(56) References Cited

U.S. PATENT DOCUMENTS

| | | | |
|---|---|---|---|
| 5,838,951 | A | 11/1998 | Song |
| 6,127,837 | A | 10/2000 | Yamamoto et al. |
| 6,756,796 | B2 | 6/2004 | Subramanian |
| 7,358,616 | B2 | 4/2008 | Alam et al. |
| 7,508,071 | B2 | 3/2009 | Cadouri |
| 7,622,313 | B2 | 11/2009 | Jones et al. |
| 7,754,532 | B2 | 7/2010 | Farrar |
| 8,150,140 | B2 | 4/2012 | Kitamura et al. |
| 2009/0152731 | A1* | 6/2009 | Inoue ............................ 257/773 |
| 2011/0065214 | A1 | 3/2011 | Farooq et al. |

FOREIGN PATENT DOCUMENTS

JP         4438585 B2      3/2010

* cited by examiner

*Primary Examiner* — Roy Potter
(74) *Attorney, Agent, or Firm* — Renaissance IP Law Group LLP

(57) ABSTRACT

A stack package includes a first semiconductor chip having a plurality of first pads, and a second semiconductor chip stacked on the first semiconductor chip and having a plurality of second pads corresponding to the first pads respectively, the second pads connected to the corresponding first pads. The first and second pads are arranged such that the first and second pads overlap with each other even after the first and second semiconductor chips are rotated relative to each other by a predetermined angle.

20 Claims, 9 Drawing Sheets

ROTATION ANGLE=0° (360°)

ROTATION ANGLE=90°

ROTATION ANGLE=180°

ROTATION ANGLE=270°

STACK PACKAGE AND METHOD OF MANUFACTURING STACK PACKAGE

PRIORITY STATEMENT

This application claims priority under 35 U.S.C. §119 to Korean Patent Application No. 10-2013-0012190, filed on Feb. 4, 2013 in the Korean Intellectual Property Office (KIPO), the contents of which are herein incorporated by reference in their entirety.

BACKGROUND

1. Field

Example embodiments relate to a stack package and a method of manufacturing the stack package. More particularly, example embodiments relate to a stack package including stacked semiconductor chips and a method of manufacturing the stack package.

2. Description of the Related Art

After a wafer is bonded on another wafer, a dicing process may be performed to form respective stack packages. Each of the wafers may include poor semiconductor chips.

Although the bonding process may be performed to complete wafer to wafer bonding, and thereby reduce manufacturing costs, since the bonding process may be performed at a wafer level, a poor chip may be bonded on a good chip, resulting in the wasting of the good chip, thereby decreasing yields of products.

SUMMARY

A stack package, comprising: a first semiconductor chip having a plurality of first pads; and a second semiconductor chip stacked on the first semiconductor chip and having a plurality of second pads corresponding to the first pads respectively, the second pads connected to the corresponding first pads. The first and second pads are arranged such that the first and second pads overlap with each other even after the first and second semiconductor chips are rotated relative to each other by a predetermined angle.

An embodiment includes a method of manufacturing a stack package, comprising: forming first and second preliminary semiconductor chips in first and second wafers respectively, the first and second preliminary semiconductor chips having a plurality of first and second pads respectively, the first and second pads being arranged such that the first and second pads overlap with each other even after the first and second semiconductor chips are rotated to each other by a predetermined angle; testing the first and second wafers to inspect the first and second preliminary semiconductor chips; aligning the first and second wafers so as to maximize the number of good first preliminary semiconductor chip aligned to good second preliminary semiconductor chip; and stacking the second wafer on the first wafer.

An embodiment includes a stack package, comprising: a first semiconductor chip having a plurality of first pads; a second semiconductor chip stacked on the first semiconductor chip and having a plurality of second pads corresponding to the first pads respectively, the second pads connected to the corresponding first pads; and a substrate having a plurality of third pads corresponding to the first pads, the first semiconductor chip is stacked on the substrate and the third pads are connected to the corresponding first pads. The first, second, and third pads are arranged such that the first, second, and third pads overlap with each other even after the first and second semiconductor chips are rotated relative to each other by a predetermined angle.

BRIEF DESCRIPTION OF THE DRAWINGS

Example embodiments will be more clearly understood from the following detailed description taken in conjunction with the accompanying drawings. FIGS. 1 to 8D represent non-limiting, example embodiments as described herein.

FIG. 1 is a cross-sectional view illustrating a stack package in accordance with example embodiments.

FIG. 2 is a plan view illustrating a first chip in FIG. 1.

FIG. 3 is a plan view illustrating a second chip in FIG. 1.

FIG. 4 is a plan view illustrating a third chip in FIG. 1.

FIG. 5 is a flow chart illustrating a method of manufacturing a stack package in accordance with example embodiments

FIG. 7 is a view illustrating a step of aligning first and second wafers in accordance with example embodiments.

FIGS. 8A to 8D are plan views illustrating first and second wafers aligned when rotated by a predetermined rotation angle.

DETAILED DESCRIPTION OF EXAMPLE EMBODIMENTS

Figure 1:
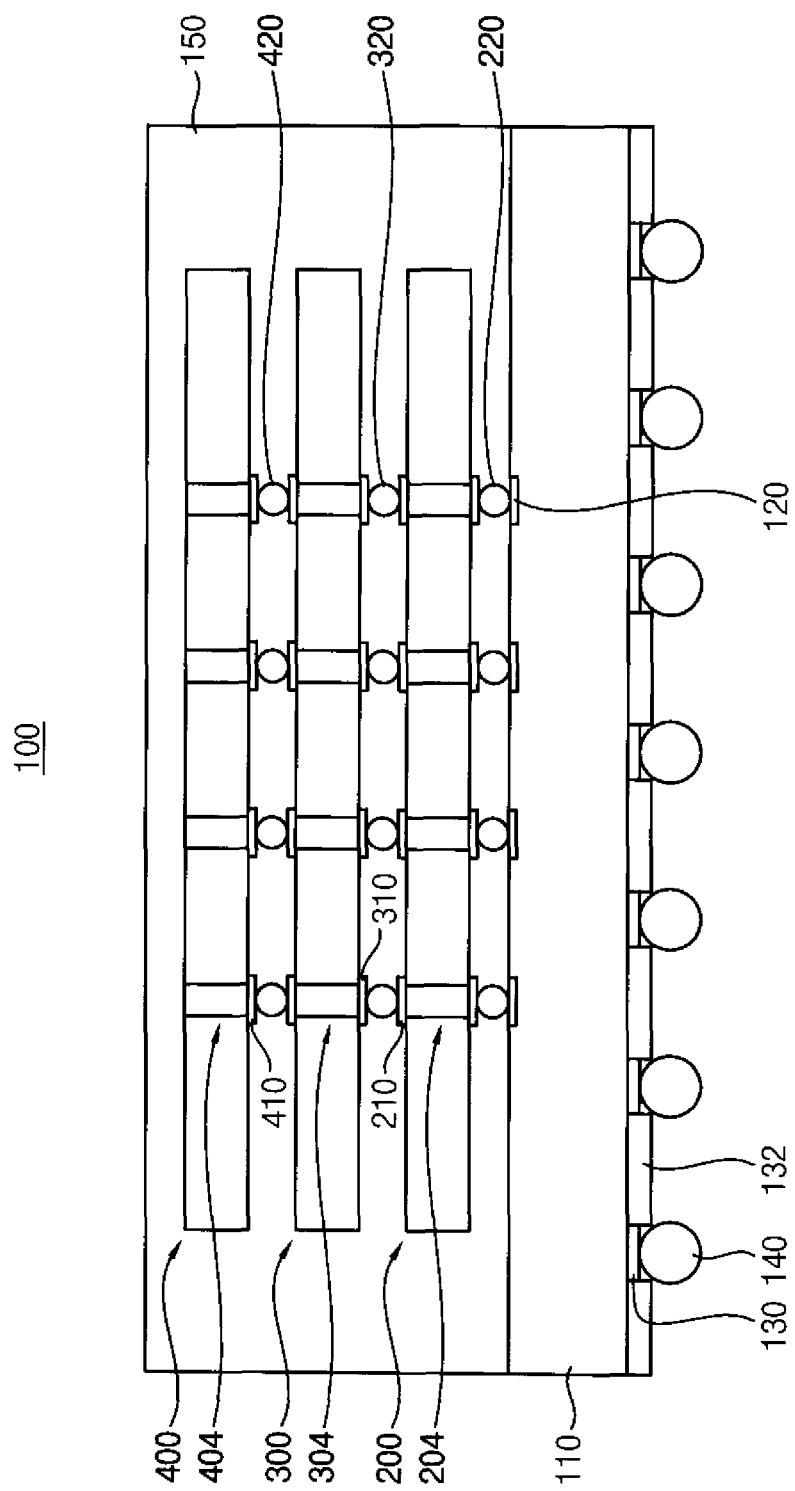

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
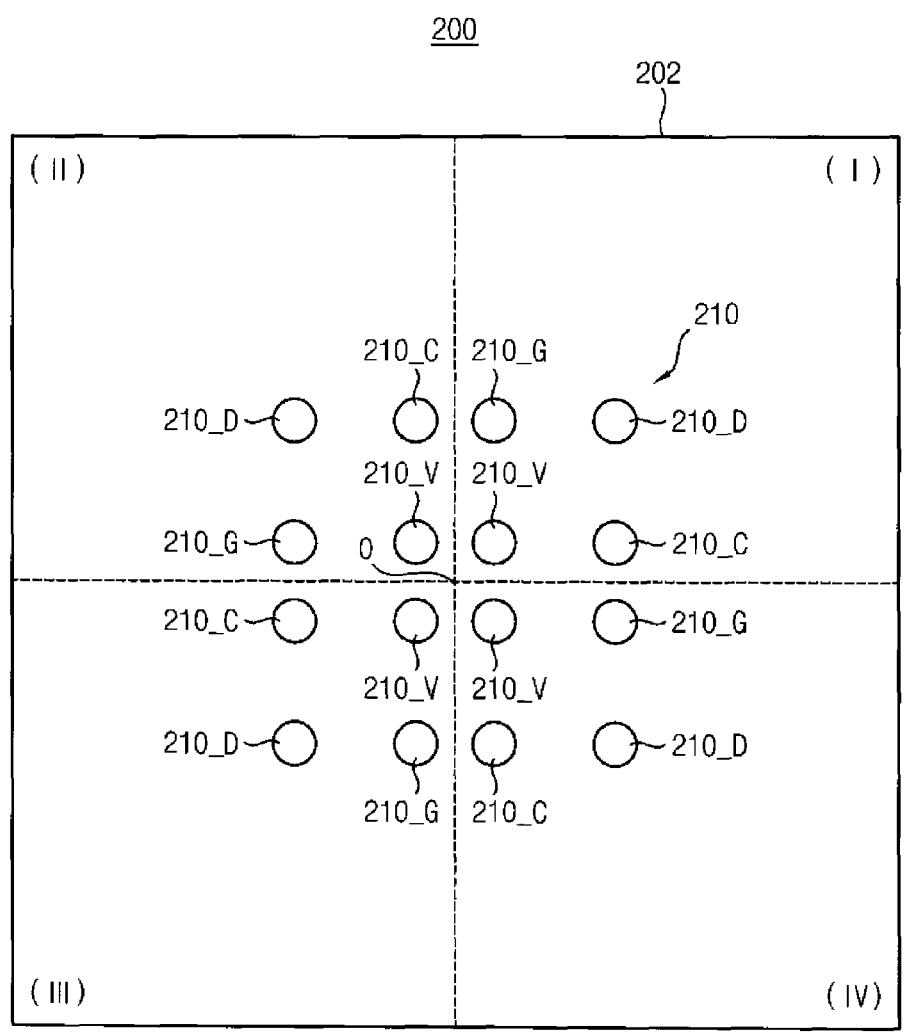
Figure 3:
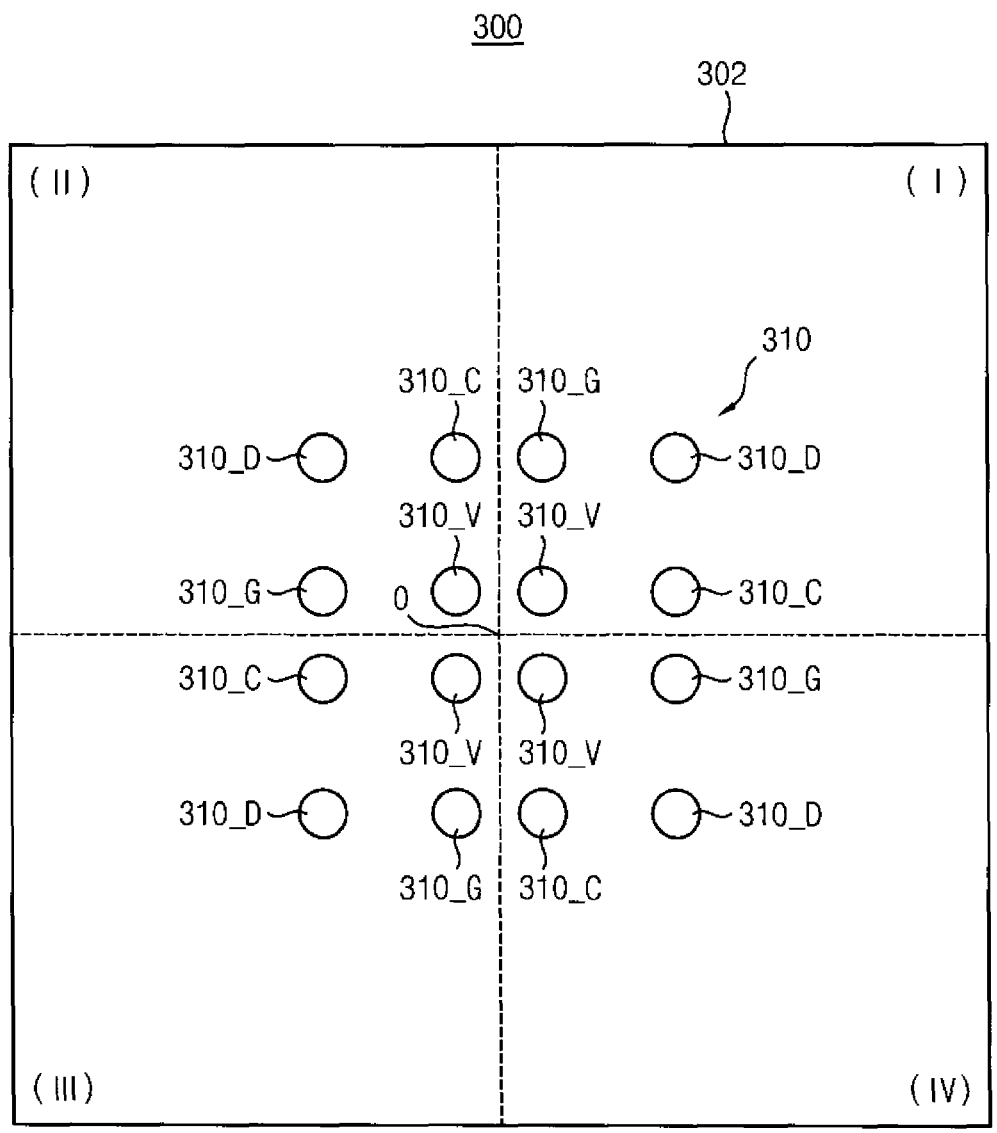
Figure 4:
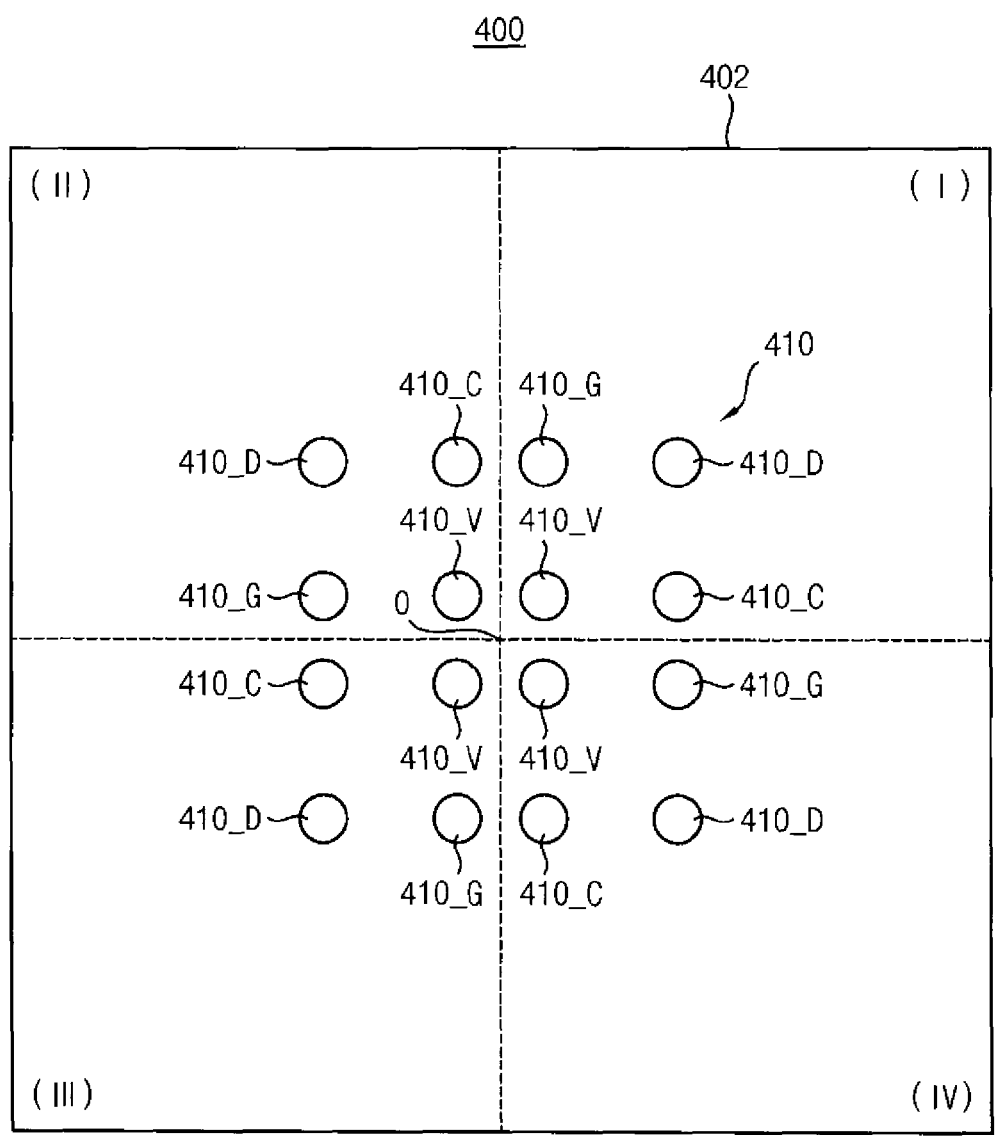

FIG. 1 is a cross-sectional view illustrating a stack package in accordance with example embodiments. FIG. 2 is a plan view illustrating a first chip in FIG. 1. FIG. 3 is a plan view illustrating a second chip in FIG. 1. FIG. 4 is a plan view illustrating a third chip in FIG. 1.

Referring to FIGS. 1 to 4, a stack package 100 may include a mounting substrate 110, and first to third semiconductor chips 200, 300 and 400 stacked on the mounting substrate 100.

In example embodiments, the mounting substrate 110 may have an upper surface and a lower surface opposite to each other. The mounting substrate 110 may be a printed circuit board (PCB). The PCB may be a multi-layered circuit board having including various circuits and vias therein. Additionally, logic chips, an interposer or memory chips having different sizes may be mounted on the mounting substrate 110.

Connection pads 120 may be formed on the upper surface of the mounting substrate 110, and outer connection pads 130 may be formed on the lower surface of the mounting substrate 110. The connection pad 120 may be exposed by an insulation layer pattern (not illustrated) on the upper surface of the mounting substrate 110, and the outer connection pad 130 may be exposed by an insulation layer pattern 132 on the lower surface of the mounting substrate 110.

The first semiconductor chip 200 may be mounted on the upper surface of the mounting substrate 110. The first semiconductor chip 200 may be mounted on the mounting substrate 110 and electrically connected to the mounting substrate 110 via a plurality of conductive connection members 220. The second semiconductor chip 300 may be stacked on the first semiconductor chip 200 and electrically connected to the first semiconductor chip 200 via a plurality of conductive connection members 320. The third semiconductor chip 400 may be stacked on the second semiconductor chip 300 and electrically connected to the second semiconductor chip 300 via a plurality of conductive connection members 420. For example, the conductive connection member may include solder.

Although the stack package 100 may include three semiconductor chips, the number of the stacked semiconductor chips may not be limited thereto. The first to third semiconductor chips 200, 300, and 400 may include a plurality of circuit elements formed therein. The circuit element may include a plurality of memory devices. Examples of the memory devices may be a volatile memory device and a non-volatile memory device. The volatile memory device may include dynamic random access memory (DRAM), static random access memory (SRAM), etc. The non-volatile memory device may include erasable programmable read-only memory (EPROM), electrically erasable programmable read-only memory (EEPROM), flash EEPROM, etc.

The first semiconductor chip 200 may include a first substrate 202 and first pads 210 on opposing surfaces of the first substrate 202. The second semiconductor chip 300 may include a second substrate 302 and second pads 310 on opposing surfaces of the second substrate 302. The third semiconductor chip 400 may include a third substrate 402 and third pads 410 on opposing surfaces of the third substrate 402.

The conductive connection members 220 may be arranged between the connection pads 120 of the mounting substrate 110 and the first pads 210 of the first semiconductor chip 200 respectively, and the first semiconductor chip 200 may be stacked on the mounting substrate 110 via the conductive connection members 220.

The conductive connection members 320 may be arranged between the first pads 210 of the first semiconductor chip 200 and the second pads 310 of the second semiconductor chip 300 respectively, and the second semiconductor chip 300 may be stacked on the first semiconductor chip 200 via the conductive connection members 320.

The conductive connection members 420 may be arranged between the second pads 310 of the second semiconductor chip 300 and the third pads 410 of the third semiconductor chip 400 respectively, and the third semiconductor chip 400 may be stacked on the second semiconductor chip 300 via the conductive connection members 420.

A sealing member 150 may be formed on the mounting substrate 110 to cover the first to third semiconductor chips 200, 300 and 400. Solder balls 140 may be disposed on the outer connection pads 132 of the mounting substrate 110, and the stack package 100 may be mounted on a module substrate (not illustrated) via the solder balls 140 to complete a memory module.

In example embodiments, the first semiconductor chip 200 may include a plurality of first through electrodes 204 that penetrate the first substrate 202. The second semiconductor chip 300 may include a plurality of second through electrodes 304 that penetrate the second substrate 302. The third semiconductor chip 400 may include a plurality of third through electrodes 404. For example, through silicon via (TSV) may be used as the first to third through electrodes 204, 304 and 404.

The first through electrodes 204 may be electrically connected to the first pads 210 respectively, the second through electrodes 304 may be electrically connected to the second pads 310 respectively, and the third through electrodes 404 may be electrically connected to the third pads 410 respectively.

In example embodiments, end portions of the first to third through electrodes 204, 304 and 404 that are exposed from the surfaces of the first to third semiconductor chips 200, 300 and 400 may be referred to as the first to third pads 210, 310 and 410. That is, instead of having discrete first to third pads 210, 310 and 410 formed on the corresponding through electrodes 204, 304, and 404, the ends portions of the through electrodes 204, 304, and 404 may operate as and/or form the first to third pads 210, 310 and 410. In this case, the conductive connection members may be disposed respectively on the end portions of the first to third through electrodes 204, 304 and 404 to electrically connect the first to third semiconductor chips 200, 300 to 400.

Alternatively, the first to third through electrodes may be formed to penetrate the first to third pads, or the first to third pads may be redistribution pads that are electrically connected to the first to third through electrodes by redistribution wirings.

The first to third through electrodes 204, 304 and 404 may be used as an electrical path for a signal or power required to operate the first to third semiconductor chips. The signal may include a data signal and a memory control signal. The memory control signal may include address signal, command signal, or clock signal. Accordingly, the signal and the power may be supplied to the first to third semiconductor chips through the first to third through electrodes.

As illustrated in FIG. 2-4, the first pads 210 may be arranged on the surface of the first substrate 202, and the second pads 310 may be arranged on the surface of the second substrate 302 facing the first substrate 202, the second pads 310 corresponding to the first pads 210. Although it is not illustrated in the figures, corresponding relation between the second and third pads may be substantially the same as that between the first and second pads. Thus, detailed descriptions concerning the corresponding relation between the second and third pads will be omitted.

In example embodiments, the first and second pads 210 and 310 may be arranged such that the first and second pads 210 and 310 may overlap with each other when rotating the first and second semiconductor chips 200 and 300 by a predetermined angle to each other.

The first pads 210 may be arranged to be symmetric to the origin (O) of the first semiconductor chip 200. The second pads 310 may be arranged to be symmetric to the origin (O) of the second semiconductor chip 300. For example, the first semiconductor chip 200 may have a square shape when view in plan view, and the second semiconductor chip 300 may have a shape substantially the same as that of the first semiconductor chip 200.

In example embodiments, the end portions of the first and the second through electrodes 204 and 304 that are exposed from the surfaces of the first and second semiconductor chips 200 and 300 may be referred to as the first and second pads 210 and 310. In this case, the first and second through electrodes 204 and 304 may be arranged such that the first and second through electrodes 204 and 304 may overlap with each other when rotating the first and second semiconductor chips 200 and 300 by a predetermined angle to each other, when viewed in plan view.

For example, the first and second pads 210 and 310 may be arranged such that the first and second pads 210 and 310 may overlap with each other when rotating the first and second semiconductor chips 200 and 300 by every 90 degrees around the origin to each other. Even though the first semiconductor chip 200 is rotated over the second semiconductor chip 300 by 90 degrees, the corresponding relation between the first and second pads 210 and 310 (that is, the first and second through electrodes) may not be changed.

In example embodiments, the first and second through electrodes 204 and 304 of the first and second semiconductor chips 200 and 300 may include a through electrode for transmitting signal and a through electrode for transmitting power. The through electrode for signal may include a data signal_through electrode and a memory control signal_through electrode. The through electrode for power may include a power voltage_through electrode and a ground voltage_through electrode.

As illustrated in FIG. 2, the first semiconductor chip 200 may include a first data signal_pad 210_D, a first memory control signal_pad 210_C, a first power voltage_pad 210_V and a first ground voltage_pad 210_G that are arranged in each of quadrant I to IV of the surface 202 of the first semiconductor chip 200.

Here, the first data signal_pad 210_D may be an end portion of a first data signal_through electrode, the first memory control signal_pad 210_C may be an end portion of a first memory control signal_through electrode, the first power voltage_pad 210_V may be an end portion of a first power voltage_through electrode, and the first ground voltage_pad 210_G may be an end portion of a first ground voltage_through electrode.

As illustrated in FIG. 3, the second semiconductor chip 300 may include a second data signal_pad 310_D, a second memory control signal_pad 310_C, a second power voltage_pad 310_V and a second ground voltage_pad 310_G that are arranged in each of first to fourth quadrants (I to IV) of the surface 302 of the second semiconductor chip 300.

Here, the second data signal_pad 310_D may be an end portion of a second data signal_through electrode, the second memory control signal_pad 310_C may be an end portion of a second memory control signal_through electrode, the second power voltage_pad 310_V may be an end portion of a second power voltage_through electrode, and the second ground voltage_pad 310_G may be an end portion of a second ground voltage_through electrode.

As illustrated in FIG. 4, the third semiconductor chip 400 may include a third data signal_pad 410_D, a third memory control signal_pad 410_C, a third power voltage_pad 410_V and a third ground voltage_pad 410_G that are arranged in each of first to fourth quadrants (I to IV) of the surface 402 of the third semiconductor chip 400.

Here, the third data signal_pad 410_D may be an end portion of a third data signal_through electrode, the third memory control signal_pad 410_C may be an end portion of a third memory control signal_through electrode, the third power voltage_pad 410_V may be an end portion of a third power voltage_through electrode, and the third ground voltage_pad 410_G may be an end portion of a third ground voltage_through electrode.

When the second semiconductor chip 300 is stacked on the first semiconductor chip 200, the second data signal_pad 310_D, the second memory control signal_pad 310_C, the second power voltage_pad 310_V and the second ground voltage_pad 310_G may overlap with the first data signal_pad 210_D, the first memory control signal_pad 210_C, the first power voltage_pad 210_V and the first ground voltage_pad 210_G, respectively. The conductive connection member 320 may be disposed between the corresponding first and second pads to electrically connect the first and second through electrodes to each other.

Accordingly, the data signal may be transmitted between the first and second semiconductor chips through the first and the second data signal_through electrodes, and the memory control signal may be transmitted between the first and second semiconductor chips through the first and second memory control signal_ through electrodes. The power voltage may be transmitted between the first and second semiconductor chips through the first and second power voltage_through electrodes, and the ground voltage may be transmitted between the first and second semiconductor chips through the first and second ground voltage_through electrodes. Similarly, when the third semiconductor chip 400 is stacked on the second semiconductor chip 300, the pads 310 and 410 may be similarly connected.

When the first semiconductor chip 200 is rotated counterclockwise around the origin (O) by every 90 degrees during a complete 360 degrees, the first data signal_pad 210_D in the first quadrant (I) may overlap sequentially with the first data signal_pads 210_D in the second quadrant (II), the third quadrant (III) and the fourth quadrant (IV). When the first semiconductor chip 200 is rotated clockwise around the origin (O) by every 90 degrees during a complete 360 degrees, the first data signal_pad 210_D in the first quadrant (I) may overlap sequentially with the first data signal_pads 210_D in the fourth quadrant (IV), the third quadrant (III) and the second quadrant (II).

When the first semiconductor chip 200 is rotated counterclockwise around the origin (O) by every 90 degrees during a complete 360 degrees, the first memory control signal_pad 210_C in the first quadrant (I) may overlap sequentially with the first memory control signal-pads 210_C in the second quadrant (II), the third quadrant (III) and the fourth quadrant (IV). When the first semiconductor chip 200 is rotated clockwise around the origin (O) by every 90 degrees during a complete 360 degrees, the first memory control signal_pad 210_C in the first quadrant (I) may overlap sequentially with the first memory control_pads 210_C in the fourth quadrant (IV), the third quadrant (III) and the second quadrant (II).

When the first semiconductor chip 200 is rotated counterclockwise around the origin (O) by every 90 degrees during a complete 360 degrees, the first power voltage_pad 210_V in the first quadrant (I) may overlap sequentially with the first power voltage_pads 210_V in the second quadrant (II), the third quadrant (III) and the fourth quadrant (IV). When the first semiconductor chip 200 is rotated clockwise around the origin (O) by every 90 degrees during a complete 360 degrees, the first power voltage_pad 210_V in the first quadrant (I) may overlap sequentially with the first power voltage_pads 210_V in the fourth quadrant (IV), the third quadrant (III) and the second quadrant (II).

When the first semiconductor chip 200 is rotated counterclockwise around the origin (O) by every 90 degrees during a complete 360 degrees, the first ground voltage_pad 210_G in the first quadrant (I) may overlap sequentially with the first ground voltage_pads 210_G in the second quadrant (II), the third quadrant (III) and the fourth quadrant (IV). When the first semiconductor chip 200 is rotated clockwise around the origin (O) by every 90 degrees during a complete 360 degrees, the first ground voltage_pad 210_G in the first quadrant (I) may overlap sequentially with the first ground voltage_pads 210_G in the fourth quadrant (IV), the third quadrant (III) and the second quadrant (II).

Accordingly, even though the first semiconductor chip 200 is rotated by a predetermined angle (for example, 90°), the pad arrangement of the first semiconductor chip 200 may not be altered such that the first pads 210 may have a same function on a same position. The second semiconductor chips 300 and 400 may have a pad arrangement substantially the same as the first semiconductor chip 200.

Thus, even though the first and second semiconductor chips 200, 300, and 400 are rotated with each other by a predetermined angle (90°), the first data signal_pad 210_D (or first data signal_through electrode) may overlap with the second data signal_pad 310_D (or second data signal_through electrode) performing the same function as the first data signal_pad 210_D, the first memory control signal_pad 210_C (or first memory control signal_through electrode) may overlap with the second memory control signal_pad 310_C (or second memory control signal_through electrode) performing the same function as the first second memory control signal_pad 210_C, the first power voltage_pad 210_V (or first power voltage_through electrode) may overlap with the second power voltage_pad 310_V (or second power voltage_through electrode) performing the same function as the first power voltage_pad 210_V, and the first ground voltage_pad 210_G (or first ground voltage_through electrode) may overlap with the second ground voltage_pad 310_G (or second ground voltage_through electrode) performing the same function as the first ground voltage_pad 210_G).

Figure 5:
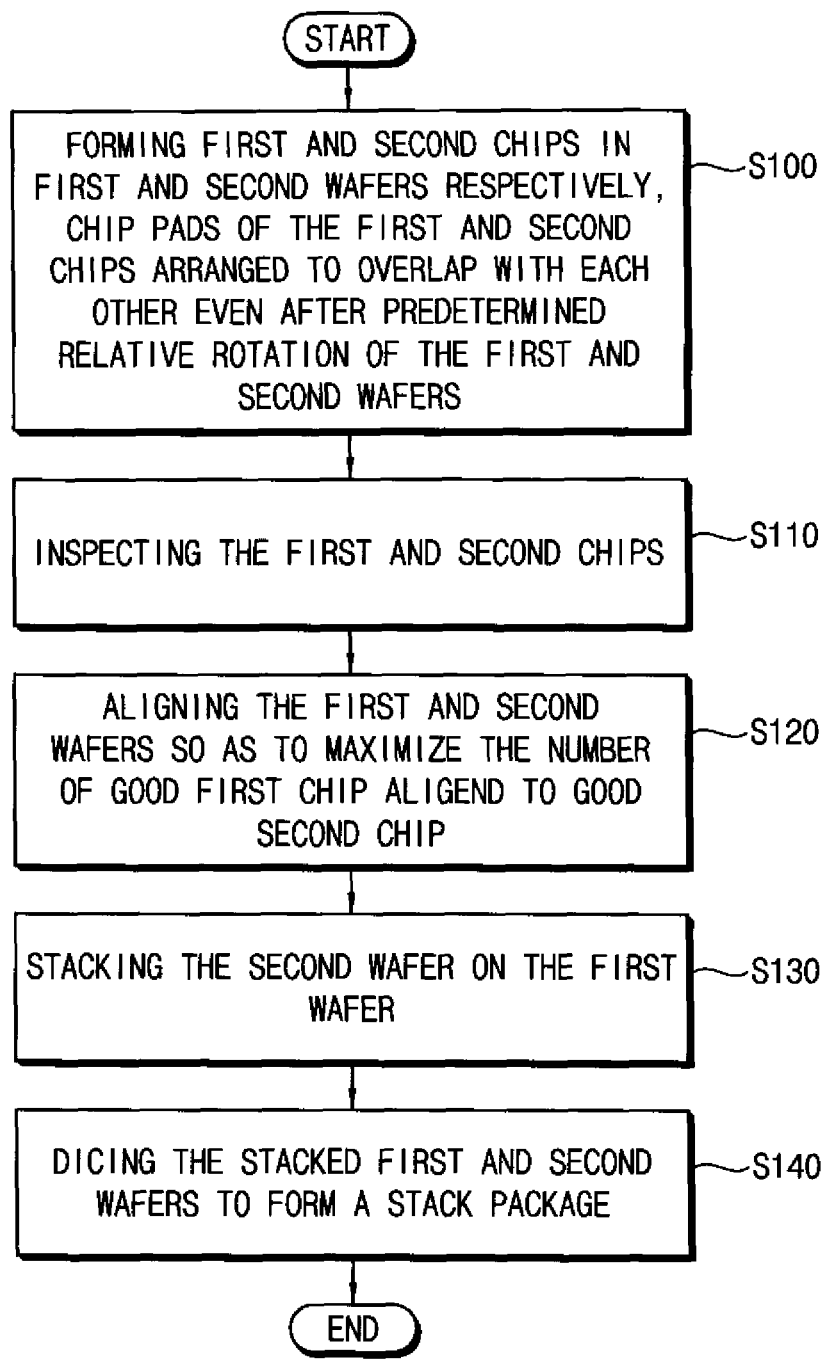
Figure 6A:
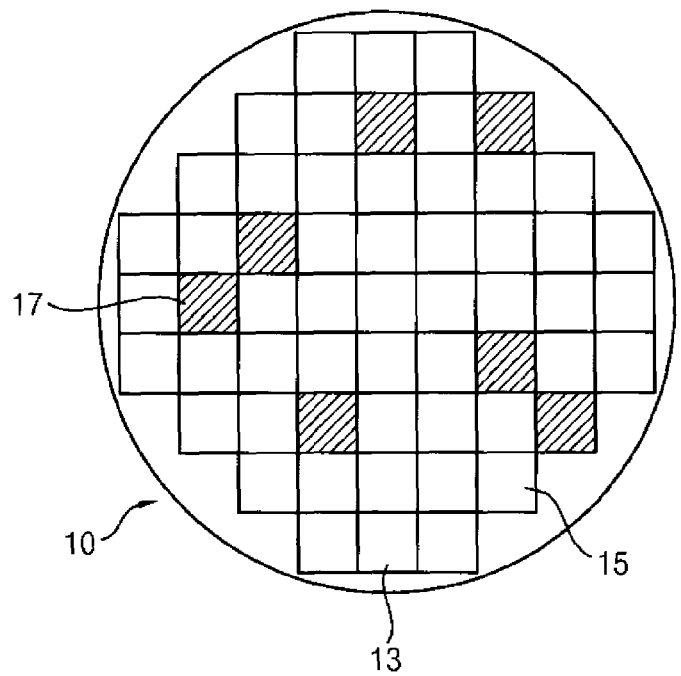
FIG. 6A is a plan view illustrating a first wafer formed by the method explained with reference to FIG. 5.
Figure 6B:
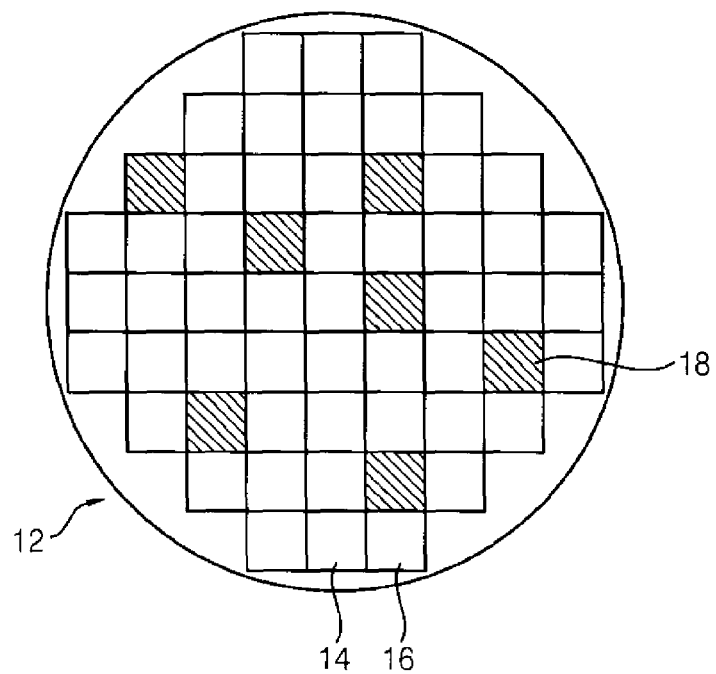
FIG. 6B is a plan view illustrating a second wafer formed by the method explained with reference to FIG. 5.
Figure 7:
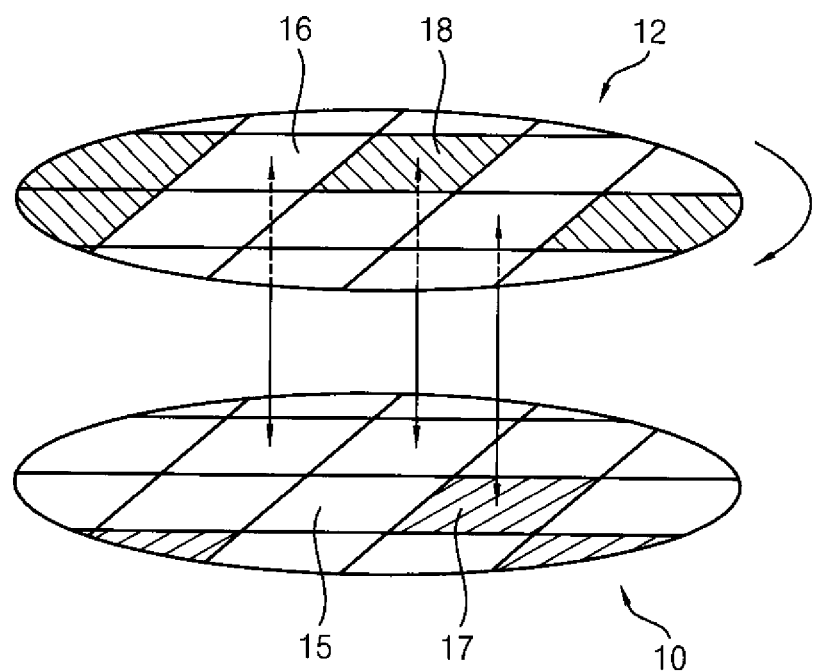
Figure 8A:
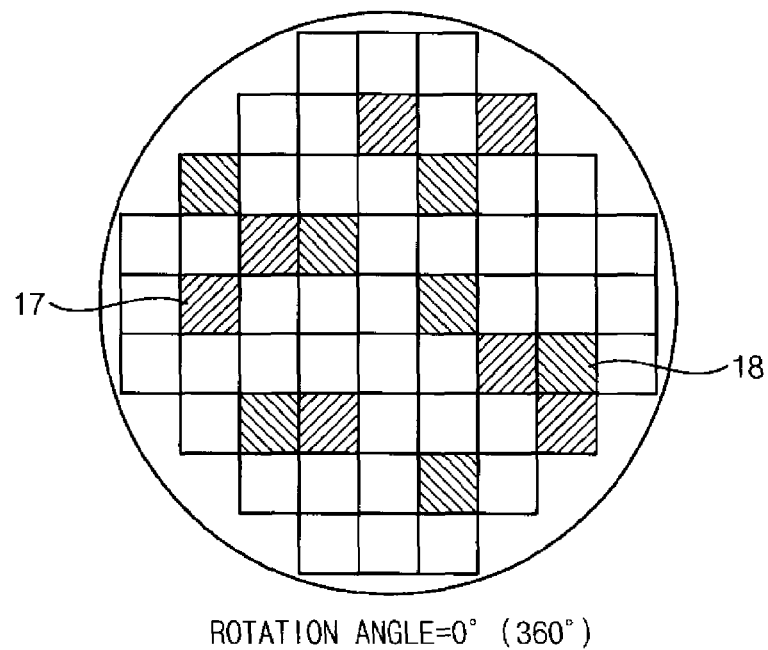
Figure 8B:
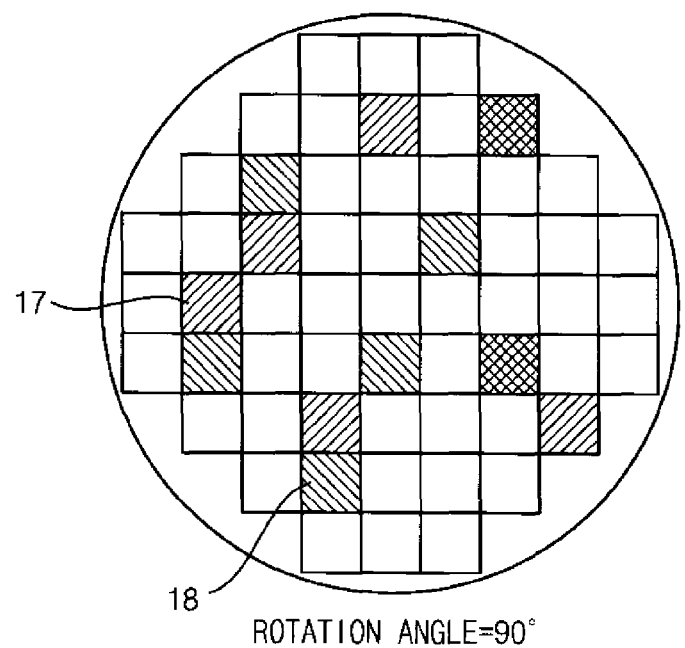
Figure 8C:
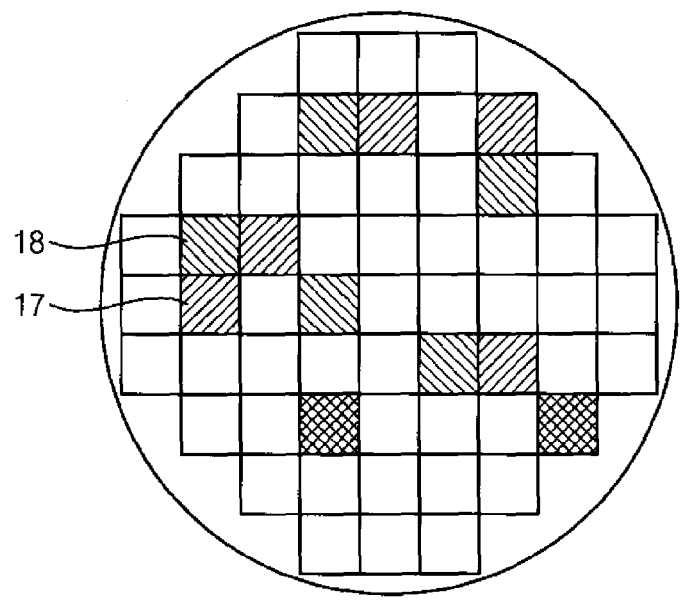
Figure 8D:
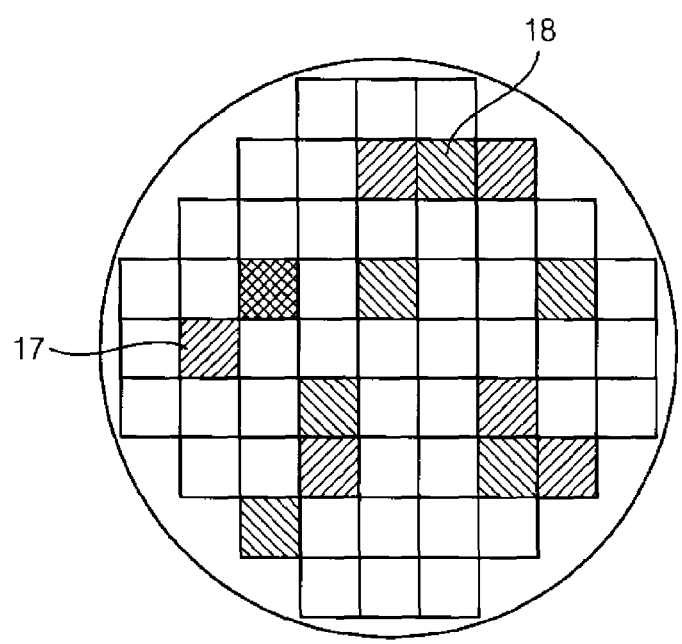

Hereinafter, a method of manufacturing the stack package in FIG. 1 will be explained in detail. FIG. 5 is a flow chart illustrating a method of manufacturing a stack package in accordance with example embodiments. FIG. 6A is a plan view illustrating a first wafer formed by the method explained with reference to FIG. 5. FIG. 6B is a plan view illustrating a second wafer formed by the method explained with reference to FIG. 5. FIG. 7 is a view illustrating a step of aligning first and second wafers in accordance with example embodiments. FIGS. 8A to 8D are plan views illustrating first and second wafers aligned when rotated by a predetermined rotation angle. FIGS. 8A and 8D represent the first and second wafers overlapping with each other; however, the wafers may represent other wafers, such as second and third wafers.

Referring to FIGS. 5, 6A and 6B, after forming a plurality of first and second preliminary semiconductor chips 13 and 14 in first and second wafers 10 and 12 respectively (S110), the first and second wafers 10 and 12 may be tested to inspect the first and second preliminary semiconductor chips 13 and 14 (S120).

In example embodiments, each of the first and second wafers 10 and 12 may include a die region and a cutting region. The first and second preliminary semiconductor chips 13 and 14 may be formed in the die region respectively. That is, the preliminary semiconductor chips may be divided by the cutting region. The cutting region may be cut by a following dicing process to form respectively separate semiconductor chips.

The first preliminary semiconductor chips 13 of the first wafer 10 may be formed corresponding to the second preliminary semiconductor chips 14 of the second wafer 12. For example, the first preliminary semiconductor chip 13 may have a square shape, and the second preliminary semiconductor chip 14 may have a shape substantially the same as that of the first preliminary semiconductor chip 13.

Accordingly, when the second wafer 12 is aligned on the first wafer 10, the second preliminary semiconductor chips 14 may overlap with the first preliminary semiconductor chips 13 respectively. Additionally, even though the second wafer 12 is rotated on the first wafer 10 by a predetermined angle (for example, 90°), second pads 310 of the second preliminary semiconductor chip 14 may overlap with first pads 210 of the first preliminary semiconductor chip 13 respectively.

After rotating the first and second wafers 10 and 12 by a predetermined angle (90°), the pad arrangement of each of the first and second preliminary semiconductor chips 13 and 14 may not be altered such that the pads thereof may have a same function on a same position.

Then, the first and second wafers 10 and 12 may be tested to determine which the first and second preliminary semiconductor chips 13 and 14 are good or bad.

As illustrated in FIGS. 6A and 6B, according to the testing, the first wafer 10 may include good first preliminary semiconductor chips 15 and poor first preliminary semiconductor chips 17, and the second wafer 12 may include good second preliminary semiconductor chips 16 and poor second preliminary semiconductor chips 18. In here, the number of the poor first preliminary semiconductor chips 17 is 7, and the number of the poor second preliminary semiconductor chips 18 is 7.

Referring to FIGS. 5, 7 to 8D, the second wafer 12 is aligned on the first wafer 10 so as to maximize the number of good chip-to-good chip combinations (S120).

First, the second wafer 12 may be arranged on the first wafer 10 such that the second preliminary semiconductor chips 14 correspond to the first preliminary semiconductor chips 13 respectively. Then, the number of the good first preliminary semiconductor chips 15 aligned with the good second preliminary semiconductor chips 17 may be counted. As illustrated in FIG. 8A, because the poor first preliminary semiconductor chip 17 does not overlap with the poor second preliminary semiconductor chip 18, the number of combinations including at least one poor chip of the aligned first and second semiconductor chips 13 and 14 is 14.

Then, after the second wafer 12 is rotated on the first wafer 10 by 90°, the number of the good first preliminary semiconductor chips 15 aligned with the good second preliminary semiconductor chips 17 may be counted. As illustrated in FIG. 8B, the number of combinations including at least one poor chip of the aligned first and second semiconductor chips 13 and 14 is 12.

Then, the process of rotating and counting may continues to repeat until the first and second wafers 10 and 12 may be rotated to each other by 360° so that every possible orientation may be considered for the alignment of the first and second wafers 10 and 12.

In particular, after the second wafer 12 is rotated on the first wafer 10 by 180°, the number of the good first preliminary semiconductor chips 15 aligned with the good second preliminary semiconductor chips 17 may be counted. As illustrated in FIG. 8C, the number of combinations including at least one poor chip of the aligned first and second semiconductor chips 13 and 14 is 12.

After the second wafer 12 is rotated on the first wafer 10 by 270°, the number of the good first preliminary semiconductor chips 15 aligned with the good second preliminary semiconductor chips 17 may be counted. As illustrated in FIG. 8D, the number of combinations including at least one poor chip of the aligned first and second semiconductor chips 13 and 14 is 13.

Accordingly, the second wafer 12 may be rotated on the first wafer 10 by 90°, 180°, or 270° to thereby maximize the number of good chip-to-good chip combinations.

After aligning the first and second wafers 10 and 12, the second wafer 12 may be stacked on the first wafer 10 (S130), and then, the stacked first and second wafers 10 and 12 may be diced to form a stack package including good first and second semiconductor chips (S140).

After conductive connection members may be disposed between the first and second pads 210 and 310 of the first and second preliminary semiconductor chips 13 and 14, the first and second wafers 10 and 12 may be adhered to each other. Then, the first and second wafers 10 and 12 may be diced to form respectively separate and stacked first and second semiconductor chips.

In example embodiments, before dicing the first and second wafers 10 and 12, a third wafer may be stacked on the second wafer 12. The third wafer may include a plurality of third preliminary semiconductor chips corresponding to the second preliminary semiconductor chips 14. The third preliminary semiconductor chip may include a plurality of third pads. Although it is not illustrated in the figures, corresponding relation between the second and third pads may be substantially the same as that between the first and second pads.

Then, the third wafer may be aligned on the second wafer 12 so as to maximize good chip-to-good chip combinations. Then, the first to third wafers may be diced to form respectively separate and stacked first to third semiconductor chips.

Referring again to FIG. 1, after the first to third semiconductor chips 200, 300, and 400 are stacked on an upper surface of a mounting substrate 110, a sealing member 150 may be formed on the mounting substrate 110 to protect the first to third semiconductor chips 200, 300, and 400 from outside. Then, solder balls 140 may be disposed on outer connection pads 132 on a lower surface of the mounting substrate 110, and a stack package 100 may be mounted on a module substrate (not illustrated) via the solder balls to complete a memory module.

According to example embodiments, the first and second wafers 10 and 12 may include a plurality of first and second preliminary semiconductor chips that correspond to each other. The first and second preliminary semiconductor chips may have first and second pads that correspond to each other.

Even after a predetermined relative rotation of the first and second wafers, the first and second preliminary semiconductor chips may overlap with each other and also the first and second pads may overlap with each other. The first and second pads may have a same function on a same position so that the pad arrangement of the first and second preliminary semiconductor chips may not be altered even after the first and second wafers are rotated to each other by a predetermined angle.

Accordingly, before bonding the first and second wafers, the first and second wafers may be aligned so as to minimize the number of good chip-to-bad chip combinations. Therefore, yields of a wafer bonding process may be improved.

Example embodiments provide a stack package including a semiconductor chip having a pad arrangement capable of increasing yields of products.

Example embodiments provide a method of manufacturing the stack package.

According to example embodiments, a stack package includes a first semiconductor chip having a plurality of first pads, and a second semiconductor chip stacked on the first semiconductor chip and having a plurality of second pads corresponding to the first pads respectively, the second pads connected to the corresponding first pads. The first and second pads are arranged such that the first and second pads overlap with each other even after the first and second semiconductor chips are rotated to each other by a predetermined angle.

In example embodiments, the first and second pads may be arranged to be symmetric to the origin of the first and second semiconductor chips respectively.

In example embodiments, the first and second semiconductor chips may have a square shape.

In example embodiments, the first and second pads may be arranged such that the first and second pads overlap with each other when the first and second semiconductor chips are rotated to each other by 90 degrees around the origin of the first and second semiconductor chips.

In example embodiments, the corresponding relation between the first and second pads remains unchanged even after when the first and second semiconductor chips are rotated to each other by 90 degrees around the origin of the first and second semiconductor chips.

In example embodiments, the first semiconductor chip may include a plurality of first through electrodes, and the second semiconductor chip may include a plurality of second through electrodes.

In example embodiments, end portions of the first and the second through electrodes that are exposed from surfaces of the first and second semiconductor chips are used as the first and second pads.

In example embodiments, the first and second pads may include pads for signal and pads for power.

In example embodiments, even after the first and second semiconductor chips are rotated to each other by a predetermined angle, the pads for signal of the second semiconductor chip may overlap with the pads for signal of the first semiconductor chip, and the pads for power of the second semiconductor chip may overlap with the pads for power of the first semiconductor chip.

In example embodiments, the stack package may further include a plurality of conductive connection members disposed between the first and second pads.

According to example embodiments, in a method of method of manufacturing a stack package, first and second preliminary semiconductor chips are formed in first and second wafers respectively, the first and second preliminary semiconductor chips having a plurality of first and second pads respectively, the first and second pads being arranged such that the first and second pads overlap with each other even after the first and second semiconductor chips are rotated to each other by a predetermined angle. The first and second wafers are tested to inspect the first and second preliminary semiconductor chips. The first and second wafers are aligned so as to maximize the number of good first preliminary semiconductor chip aligned to good second preliminary semiconductor chip. The second wafer is stacked on the first wafer.

In example embodiments, the first and second pads may be arranged such that the first and second pads overlap with each other when the first and second wafers are rotated to each other by 90 degrees.

In example embodiments, aligning the first and second wafers may include rotating the second wafer on the first wafer 10 by 90°, counting the number of the good first preliminary semiconductor chips aligned with the good second preliminary semiconductor chips, and repeating the steps of rotating and counting until the first and second wafers are rotated to each other by 360°.

In example embodiments, the method may further include arranging a third wafer on the second wafer, the third wafer including a plurality of third preliminary semiconductor chips, and aligning the first and third wafers so as to maximize the number of good chip-to-good chip combinations.

In example embodiments, the method may further include dicing the stacked first and second wafers to form a stack package.

According to example embodiments, the first and second wafers may include a plurality of first and second preliminary semiconductor chips that correspond to each other. The first and second preliminary semiconductor chips may have first and second pads that correspond to each other.

Even after a predetermined relative rotation of the first and second wafers, the first and second preliminary semiconductor chips may overlap with each other and also the first and second pads may overlap with each other. The first and second pads may have a same function on a same position so that the pad arrangement of the first and second preliminary semiconductor chips may not be altered even after the first and second wafers are rotated to each other by a predetermined angle.

Accordingly, before bonding the first and second wafers, the first and second wafers may be aligned so as to minimize the number of good chip-to-bad chip combinations. Therefore, yields of a wafer bonding process may be improved.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A stack package, comprising:
 a first semiconductor chip having a plurality of first pads; and
 a second semiconductor chip stacked on the first semiconductor chip and having a plurality of second pads corresponding to the first pads respectively, the second pads connected to the corresponding first pads,
 wherein the first and second pads are arranged such that the first and second pads overlap with each other even after the first and second semiconductor chips are rotated relative to each other by a predetermined angle.

2. The stack package of claim 1, wherein the first and second pads are arranged to be symmetric to the origin of the first and second semiconductor chips respectively.

3. The stack package of claim 1, wherein the first and second semiconductor chips has a square shape.

4. The stack package of claim 3, wherein the first and second pads are arranged such that the first and second pads overlap with each other when the first and second semiconductor chips are rotated relative to each other by 90 degrees around the origin of the first and second semiconductor chips.

5. The stack package of claim 3, wherein the corresponding relation between the first and second pads remains unchanged even after when the first and second semiconductor chips are rotated relative to each other by 90 degrees around the origin of the first and second semiconductor chips.

6. The stack package of claim 1, wherein the first semiconductor chip comprises a plurality of first through electrodes, and the second semiconductor chip comprises a plurality of second through electrodes.

7. The stack package of claim 6, wherein end portions of the first and the second through electrodes that are exposed from surfaces of the first and second semiconductor chips are used as the first and second pads.

8. The stack package of claim 1, wherein the first and second pads comprise pads for signal and pads for power.

9. The stack package of claim 8, wherein even after the first and second semiconductor chips are rotated relative to each other by a predetermined angle, the pads for signal of the second semiconductor chip overlap with the pads for signal of the first semiconductor chip, and the pads for power of the second semiconductor chip overlap with the pads for power of the first semiconductor chip.

10. The stack package of claim 1, further comprising a plurality of conductive connection members disposed between the first and second pads.

11. A method of manufacturing a stack package, comprising:
    forming first and second preliminary semiconductor chips in first and second wafers respectively, the first and second preliminary semiconductor chips having a plurality of first and second pads respectively, the first and second pads being arranged such that the first and second pads overlap with each other even after the first and second semiconductor chips are rotated to each other by a predetermined angle;
    testing the first and second wafers to inspect the first and second preliminary semiconductor chips;
    aligning the first and second wafers so as to maximize the number of good first preliminary semiconductor chip aligned to good second preliminary semiconductor chip; and
    stacking the second wafer on the first wafer.

12. The method of claim 11, wherein the first and second pads are arranged such that the first and second pads overlap with each other when the first and second wafers are rotated relative to each other by 90 degrees.

13. The method of claim 11, wherein aligning the first and second wafers comprises
    rotating the second wafer on the first wafer by 90°;
    counting the number of the good first preliminary semiconductor chips aligned with the good second preliminary semiconductor chips; and
    repeating the steps of rotating and counting until the first and second wafers are rotated to each other by 360°.

14. The method of claim 11, further comprising
    arranging a third wafer on the second wafer, the third wafer including a plurality of third preliminary semiconductor chips; and
    aligning the first and third wafers so as to maximize the number of good chip-to-good chip combinations.

15. The method of claim 1, further comprising dicing the stacked first and second wafers to form a stack package.

16. A stack package, comprising:
    a first semiconductor chip having a plurality of first pads;
    a second semiconductor chip stacked on the first semiconductor chip and having a plurality of second pads corresponding to the first pads, respectively, the second pads connected to the corresponding first pads; and
    a substrate having a plurality of third pads corresponding to the first pads, the first semiconductor chip is stacked on the substrate and the third pads are connected to the corresponding first pads;
    wherein the first, second, and third pads are arranged such that the first, second, and third pads overlap with each other even after the first and second semiconductor chips are rotated relative to each other by a predetermined angle.

17. The stack package of claim 16, wherein the first semiconductor chip comprises a plurality of first through electrodes, and the second semiconductor chip comprises a plurality of second through electrodes.

18. The stack package of claim 17, wherein end portions of the first and the second through electrodes that are exposed from surfaces of the first and second semiconductor chips are used as the first and second pads.

19. The stack package of claim 16, wherein the first, second, and third pads comprise pads for at least one of power, control signal, data, and ground pads.

20. The stack package of claim 16, wherein the first, second, and third pads are arranged to be symmetric to an origin of the first and second semiconductor chips and the substrate, respectively.

* * * * *